(12) United States Patent
Yamazaki et al.

(10) Patent No.: US 6,664,001 B2
(45) Date of Patent: Dec. 16, 2003

(54) LAYERED SUBSTRATE WITH BATTERY

(75) Inventors: Akihisa Yamazaki, Asaka (JP); Youichi Sawachi, Asaka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 288 days.

(21) Appl. No.: 09/836,321

(22) Filed: Apr. 18, 2001

(65) Prior Publication Data

US 2001/0033963 A1 Oct. 25, 2001

(30) Foreign Application Priority Data

Apr. 21, 2000 (JP) ........................................ 2000-121099

(51) Int. Cl.$^7$ ............................. H01M 6/12; H01M 6/46
(52) U.S. Cl. ...................................................... 429/162
(58) Field of Search ......................................... 429/162

(56) References Cited

U.S. PATENT DOCUMENTS

| | | | | |
|---|---|---|---|---|
| 4,080,728 A | * | 3/1978 | Buckler | 29/623.4 |
| 4,105,815 A | * | 8/1978 | Buckler | 429/152 |
| 5,124,508 A | * | 6/1992 | DuBrucq | 174/260 |
| 5,147,985 A | * | 9/1992 | DuBrucq | 174/260 |
| 6,288,457 B1 | * | 9/2001 | Kako et al. | 307/119 |
| 6,299,653 B1 | * | 10/2001 | Hoshi et al. | 29/623.1 |

FOREIGN PATENT DOCUMENTS

| | | | | |
|---|---|---|---|---|
| JP | 7-22005 | 1/1995 | ............ | H01M/2/10 |
| JP | 10-126667 | 5/1998 | .......... | H04N/5/225 |

* cited by examiner

Primary Examiner—Randy Gulakowski
Assistant Examiner—Donald V. Scaltrito
(74) Attorney, Agent, or Firm—Sughrue Mion, PLLC

(57) ABSTRACT

Sheet batteries are connected in series, layered and sandwiched between an upper substrate and a lower substrate, and the sheet batteries, the upper substrate and the lower substrate form a layered substrate with the batteries. Holes for wires of ICs are formed in the layered substrate. Applied voltages are determined according to batteries to which the holes are formed. The voltages of the sheet batteries may be uniform, or different.

21 Claims, 8 Drawing Sheets

F I G. 1
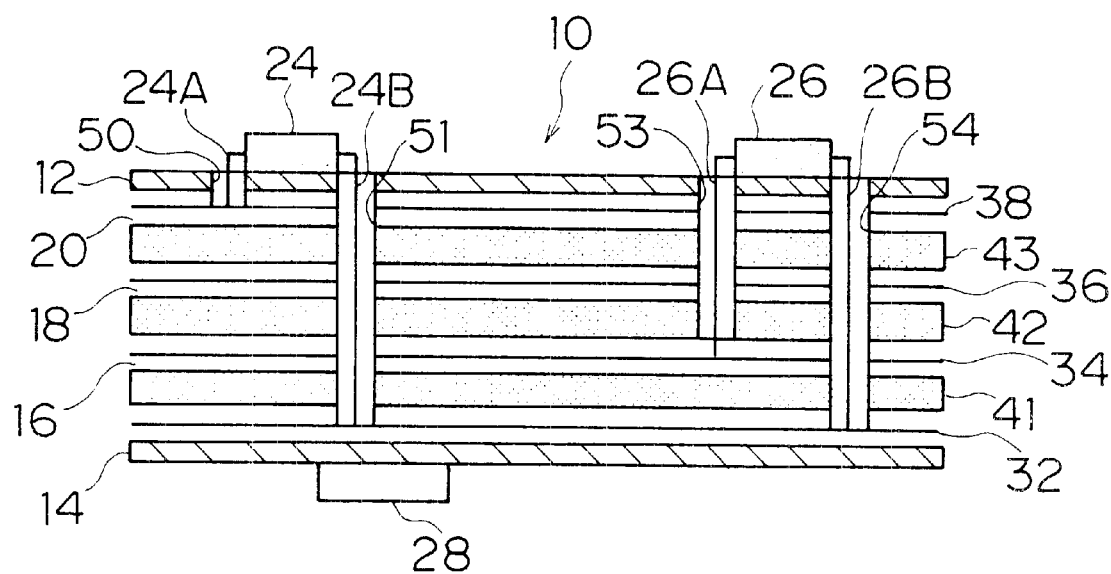

F I G. 2
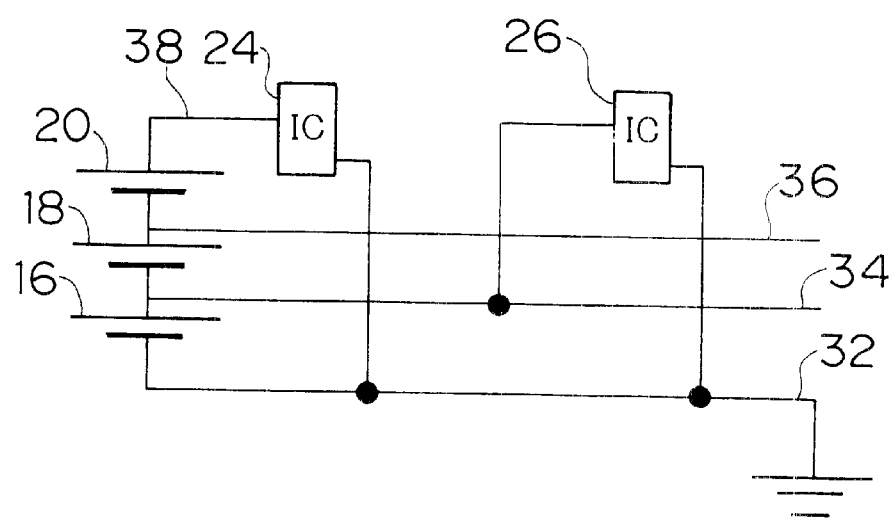

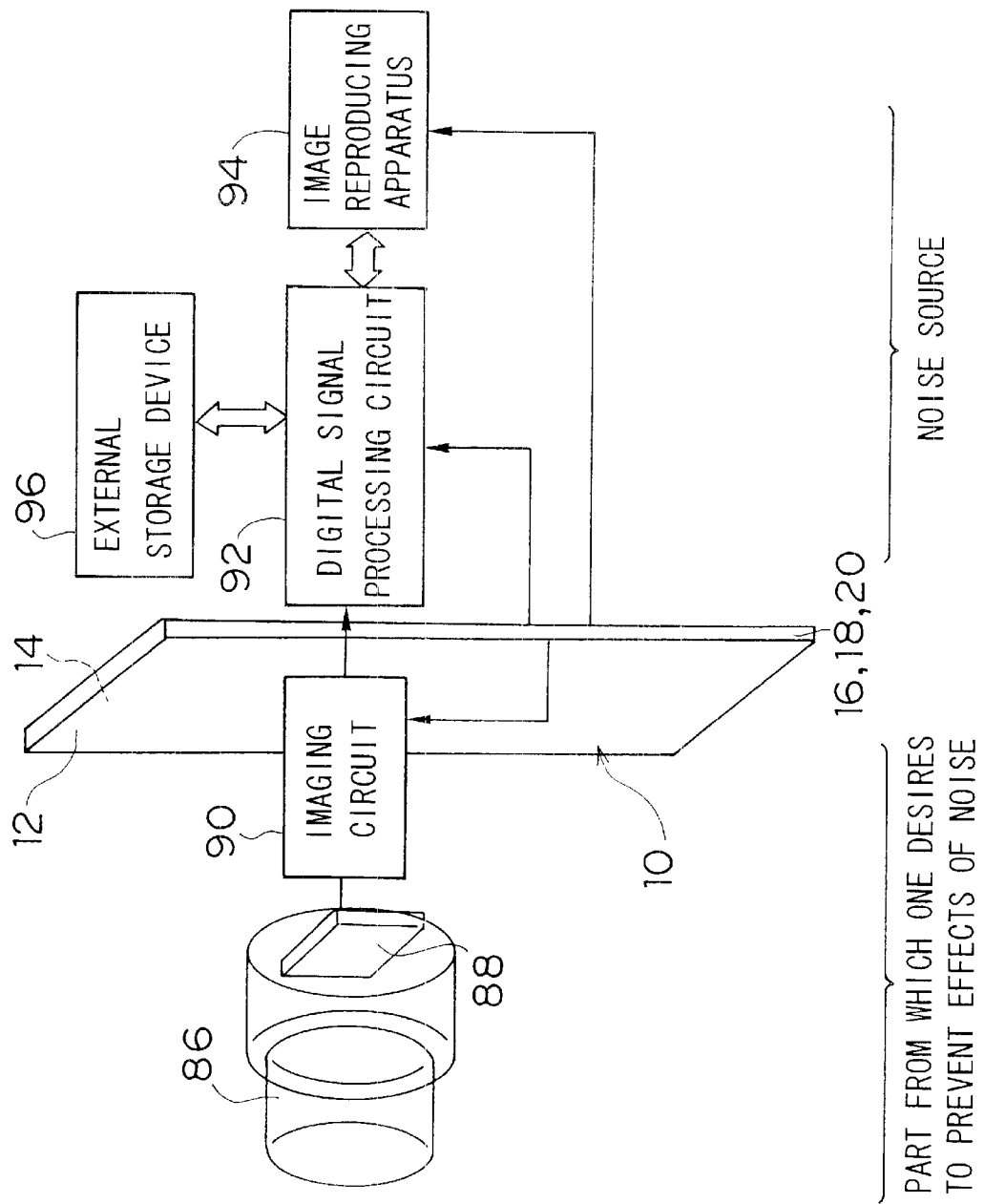

LAYERED SUBSTRATE WITH BATTERY

BACKGROUND OF THE INVENTION

1. Field of the Invention

The present invention relates to a substrate on which electronic parts are mounted, specifically to a layered substrate used for a compact electronic device or the like.

2. Description of the Related Art

Recently, a compact electronic device such as a portable terminal has become smaller and thinner, and an electric circuit of the device has become more integrated. A battery used for such a device has become thinner, and so-called sheet batteries are used in Japanese Patent Application Laid-open Nos. 7-22005 and 10-126667.

Japanese Patent Application Laid-open No. 7-22005 discloses an arrangement of the thin battery within a device. The thin battery is arranged above a substrate with its end in contact with the substrate. Japanese Patent Application Laid-open No. 10-126667 discloses a thin electronic still camera in which the sheet batteries are arranged within external casings.

However, these inventions can not reduce size and thickness of devices any further.

SUMMARY OF THE INVENTION

The present invention has been developed in view of the above-described circumstances, and has as its object the provision of a layered substrate that can reduce size and thickness of a compact electronic device.

In order to achieve the above-described object, the present invention is directed to a layered substrate, comprising: a substrate; and a sheet battery, wherein the substrate and the sheet battery form layers.

The layered substrate can reduce the thickness of an electronic device, and power for electronic parts on the substrates can be directly supplied from the battery of the layered substrate; wiring can be thus simplified.

The sheet batteries may be layered. In this case, different voltages can be directly applied from the batteries to the electronic parts on the substrates without a dc converter.

At least one substrate and at least one sheet battery on which electronic parts are mounted may form a layered substrate in layers. Two substrates on which electronic parts are mounted and at least one sheet battery sandwiched between the two substrates may form a layered substrate in layers.

The sheet batteries may be layered and connected in series.

Holes may be formed to reach electrode surfaces of at least one of the sheet batteries and wires may be inserted through the holes so that at least one power is supplied from the sheet batteries through the wires. In case the batteries are layered and connected in series, at least one voltage drawn through the wires is determined according to the electrode surfaces to which the holes are formed.

The layered substrate may be divided into areas from which kinds of electric power of different voltages are respectively drawable.

The layered substrate may further comprise ground electrode plates and at least one switch that electrically connects and disconnects the ground electrode plates. Power is supplied to electronic parts mounted on the substrates when the switch is on, and the power supply is cut when the switch is off.

The layered substrate may be arranged between an electric noise source and a circuit to prevent noise of the electric noise source from affecting the circuit.

A circuit for the digital signal processing including noise source may be printed on one of the two substrates and a circuit for analog signal processing may be printed on the other substrate so that noise of the noise source is prevented from affecting the circuit for the analog signal processing.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a section view of a layered substrate with batteries according to an embodiment of the present invention;

FIG. 2 is a view showing a circuit of the layered substrate in FIG. 1;

FIG. 8 is a view showing a structure of the electronic camera that uses the layered substrate with batteries.

DETAILED DESCRIPTION OF THE PREFERRED EMBODIMENTS

Figure 3:
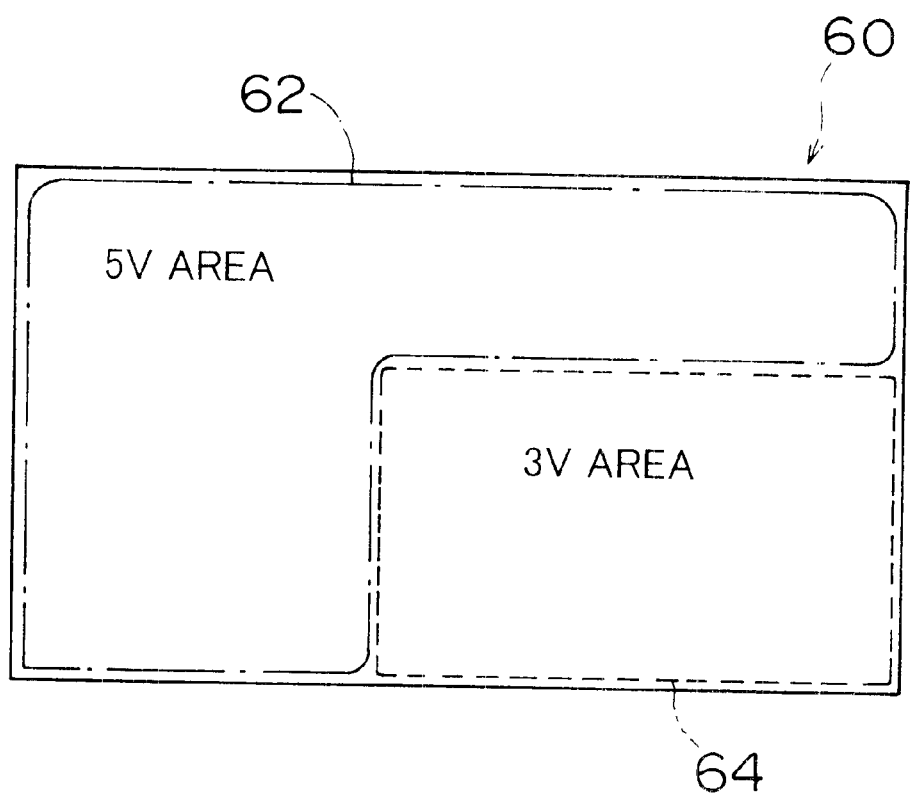
FIG. 3 is a plan view of the layered substrate with batteries for another embodiment of the present invention.

Hereunder a preferred embodiment of the present invention will be described in detail in accordance with the accompanying drawings.

FIG. 1 is a section view showing an embodiment of the present invention, and FIG. 2 shows a circuit of the embodiment. A layered substrate 10 in FIG. 1 has an upper substrate 12, a lower substrate 14, and three sheet batteries 16, 18, and 20 between the substrates 12 and 14. ICs 24 and 26 are disposed on the upper substrate 12 as electronic parts, and voltages of the ICs 24 and 26 are, for example, 5.0 V and 2.0 V, respectively. A reference number 28 is an IC which is disposed on the lower substrate 14.

In FIG. 1, the batteries 16, 18, and 20 are called, from the bottom to the top, the first sheet battery 16, the second sheet battery 18 and the third sheet battery 20. In this embodiment, the voltages of the first sheet battery 16, the second sheet battery 18, and the third sheet battery 20 are 2.0 V, 1.3 V, and 1.7 V, respectively, and the sheet batteries 16, 18, and 20 are connected in series.

The sheet batteries 16, 18, and 20 are disposed while being firmly contacted between the upper substrate 12 and the lower substrate 14. Reference numbers 32, 34, and 36 are electrode plates for the sheet batteries 16, 18, and 20, respectively, and reference numbers 41, 42, and 43 are battery media. The electrode plate 34 is used for both a cathode of the first sheet battery 16 as well as an anode of the second sheet battery 18, and the electrode plate 36 is used for both a cathode of the second sheet battery 18 as well as an anode of the third sheet battery 20.

On the layered substrate 10, holes 50 and 51 for power connect wires 24A and 24B of the IC 24, and holes 53 and 54 for power connect wires 26A and 26B of the IC 26 are formed. The hole 50 reaches a cathode plate 38 of the third sheet battery 20, whereas the hole 51 reaches an anode plate 32 of the first sheet battery 16. The power connect wire 24A is inserted through the hole 50 to the electrode plate 38. The power connect wire 24B is inserted through the hole 51 to the electrode plate 32. The voltage of 5.0 V is thereby supplied to the IC 24.

Now viewing the hole 53, it reaches the cathode plate 34 of the second sheet battery 18, whereas the hole 54 reaches the electrode plate 32 of the anode plate 32 of the first sheet battery 16. The power connect wire 26A of the IC 26 is inserted through the hole 53 to the electrode plate 34. The power connect wire 26B is inserted through the hole 54 to the electrode plate 32. The voltage of 2.0 V is thereby applied to the IC 26. Although not shown in the drawing, a hole reaches the cathode plate 34 of the second sheet battery 18 in a case that 3.3 V is required.

In the layered substrate 10 which is constructed as described above, the sheet batteries 16, 18, and 20 are sandwiched between the upper substrate 12 and the lower substrate 14 in layers, and thus the layered substrate 10 with a substrate and batteries integrated is constructed. Thus, the powers can be directly supplied from the sheet batteries 16, 18, and 20 to the substrates 12 and 14. In particular, the sheet batteries 16, 18, and 20 are connected in series and layered, and necessary electrode plates 32, 34, 36, and 38 are connectable via the holes 50, 51, 53, and 54; hence a plurality of voltages can be drawn corresponding with depths of the holes.

The sheet batteries 16, 18, and 20 of the layered substrate 10 can be so designed as to adjust capacity suitable for the respective loads. Because the sheet batteries 16, 18, and 20 are integrated as the layered substrate 10, exchanging of batteries is difficult; however, a secondary battery is used as a sheet battery and a charging circuit (not shown) may be provided within a device in which the layered substrate is incorporated. This makes the sheet batteries rechargeable, and the sheet batteries can be reused.

According to the present embodiment, the voltages for the substrates can be applied without a dc converter; consequently, the electronic device can be thinner and at the same time the circuit structure can be simplified.

In the above description, the three sheet batteries 16, 18, and 20 are presented, but the number of the sheet batteries is not limited to three, and it may be any if more than one. The voltages of the sheet batteries may be uniform, or may be different. In FIG. 1, the sheet batteries 16, 18, and 20 are sandwiched between the upper substrate 12 and the lower substrate 14, but either of the substrates 12 and 14 may be omitted.

FIG. 3 shows another embodiment. As seen from FIG. 3, use of sheet batteries 62 and 64 of a layered substrate 60 is altered in purpose of supplying different voltages area by area of the substrate. In an example in FIG. 3, a surface of the substrate 60 has two areas: an area where a voltage of 5.0 V can be applied (hereunder called a 5 V area) and an area where a voltage of 3.0 V can be applied (hereunder called a 3 V area). The sheet battery 62 for 5.0 V is in the 5 V area whereas the sheet battery 64 for 3.0 V is in the 3 V area.

By the above-described embodiment, the plurality of voltages for the substrate can be easily drawn. Three or more voltage areas may be provided, and shapes of the areas are unlimited.

Figure 4:
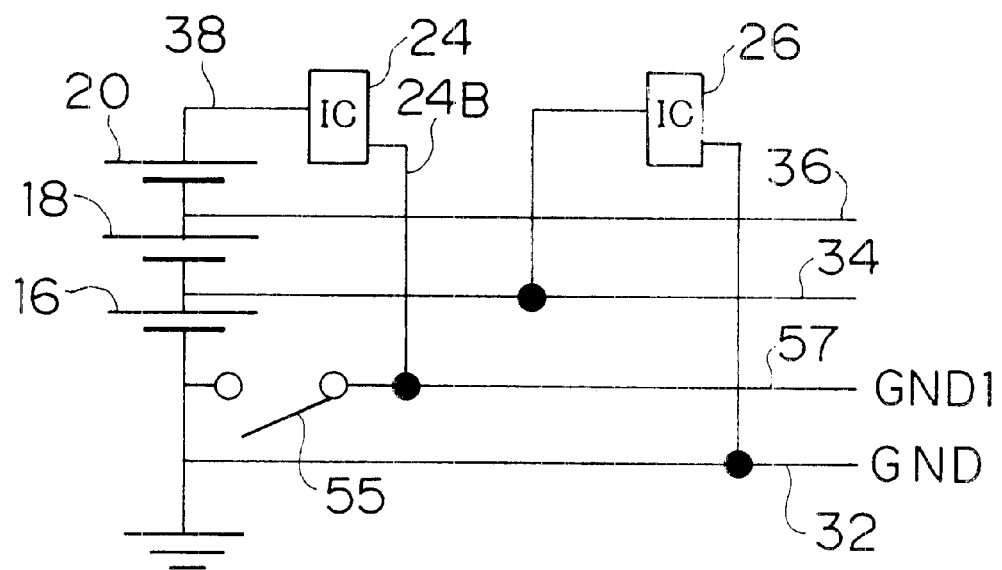
FIG. 4 is a view showing a circuit of the layered substrate with batteries which has a turning ON/OFF device of power.
Figure 5:
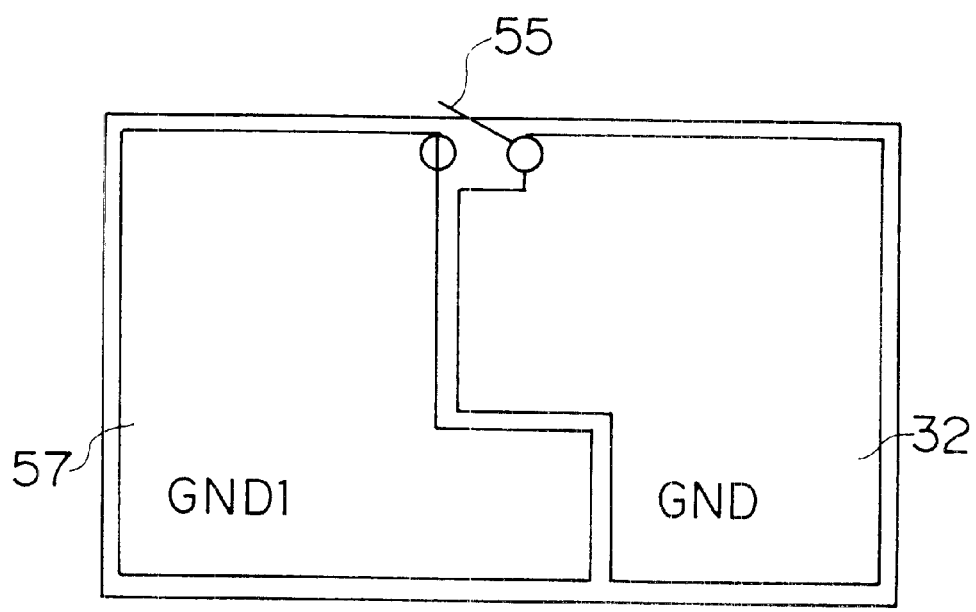
FIG. 5 is a plan view showing a state where a ground area of the layered substrate in FIG. 4 is divided.

Next, a description will be given of a turning ON/OFF device of the power in the layered substrate with the sheet batteries. FIG. 4 is a view showing a circuit of the layered substrate provided with the turning ON/OFF device of the power, and FIG. 5 is a plan view showing an arrangement of the ground electrode plates. In FIG. 4, common or similar parts as those shown in FIG. 2 are assigned the same reference numbers. An IC to which the reference number 26 is assigned in FIG. 4 is an IC for controlling the power. The power is always supplied from the sheet battery 16 to the IC 26, and a switch 55 is controlled by the IC 26.

The switch 55 is provided between the GND electrode plate 32 and a GND1 electrode plate 57. When the switch 55 is turned ON, the GND1 electrode 57 is connected with the GND electrode plate 32. When the switch 55 is turned OFF, the GND1 electrode plate 57 is electrically disconnected from the GND electrode plate 32.

A power connect terminal 24B of an IC to which a reference number 24 is assigned is connected with the GND1 electrode plate 57, and the power to the IC 24 can be supplied and stopped by controlling the switch 55 in the ON/OFF manner from the IC 26.

Moreover, as seen from FIG. 5, as to the substrate area of the layered substrate 10, a ground area corresponding with the GND electrode plate 32 described in accompany with FIG. 4 and a ground area corresponding with the GND1 electrode plate 57 are divided, so that the ground areas can be electrically connected and disconnected. In a case that electronic parts with the same power supply timing are arranged, dividing of the ground areas can be easily done by arranging the parts closely.

Another embodiment that uses the sheet batteries will be described from now on.

A photographing apparatus such as a digital camera, or an audio apparatus such as an audio recorder and an audio player, has a problem in that electric noise of the electronic device is recorded as a recording signal at recording. In order to eliminate this, a noise source is shielded with an electromagnetic shielding plate (shield plate); however, thickness of the device is increased due to the shield plate. In view of the problem, use of the thin sheet batteries also as an electromagnetic shielding device is suggested.

Figure 6:
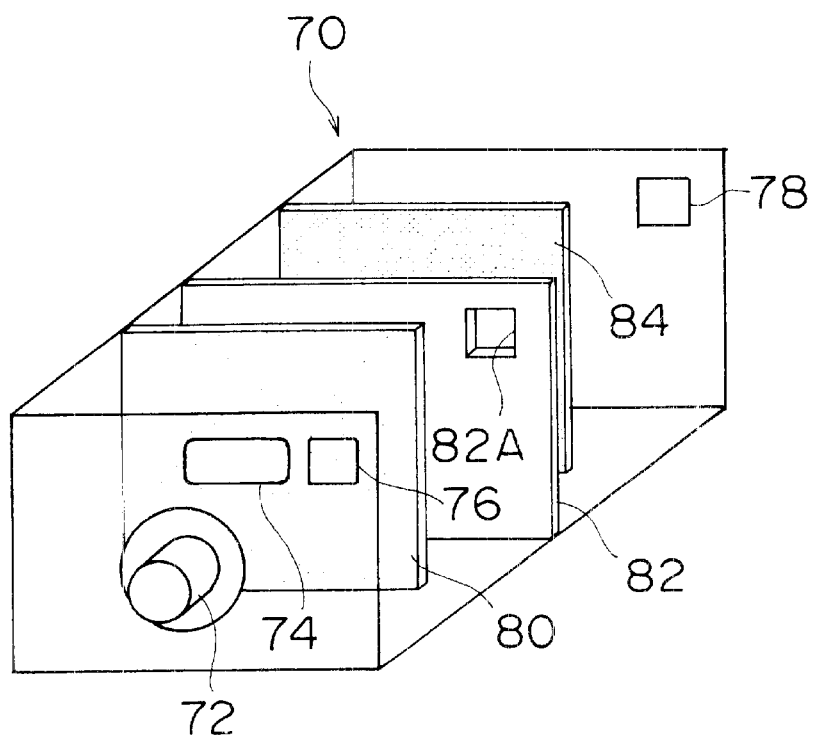
FIG. 6 is an disassembled perspective view of an electronic camera showing another embodiment using the sheet batteries.

The embodiment is shown in FIG. 6. An electronic camera 70 is provided with a lens 72, a strobe 74, and a finder opening 76, and the rear face of the electronic camera 70 is provided with an image display device such as a liquid crystal monitor, a finder eyepiece, a zoom lever (not shown), and so forth.

At the rear of the lens 72, a solid state imaging device (not shown in FIG. 6) such as a CCD is arranged. An image that is taken by the solid state imaging device is converted into digital image data through a predetermined signal processing, and is recorded into a memory card (not shown) or other record media.

A reference number 80 in FIG. 6 is an imaging circuit substrate, and a reference number 82, 84, are a sheet battery and a power circuit substrate, respectively. The imaging circuit substrate 80 is provided with an imaging circuit for processing the solid state imaging device and an output signal from the solid state imaging device. On the other hand, a power circuit substrate 84 has a circuit that oscillates by a predetermined frequency like the dc converter, thus it is an electric noise source. Although the power circuit substrate 84 is arranged at the rear face of the camera 70, but noise generated from the power circuit plate 84 affects the imaging circuit including the solid state imaging device by electromagnetic induction, and the noise component is added to the image signal.

In order to solve the problem, the sheet battery 82 is arranged between the imaging circuit substrate 80 and the power circuit substrate 84. Because it is arranged in this manner, the sheet battery 82 serves as an electromagnetic shielding plate, hence the effects of noise can be eliminated without providing the shield plate. The predetermined power is then supplied from the sheet battery 82 to the imaging circuit and other circuits via the power circuit substrate 84. In addition, an opening 82A for a finder optical path is formed on the sheet battery 82.

In the embodiment related to FIG. 6, an electronic camera 70 is used and the imaging circuit substrate 80 and the power circuit substrate 84 are separated by the sheet battery 82; however the embodiment is not limited only to that. For example, an image display device (not shown) such as a liquid crystal monitor is determined as a noise source, and the device and the imaging circuit may be separated. In another example, an analog part and a digital part of the imaging circuit may be constructed separately, and the sheet battery may be arranged between an analog substrate and a digital substrate.

Figure 7:
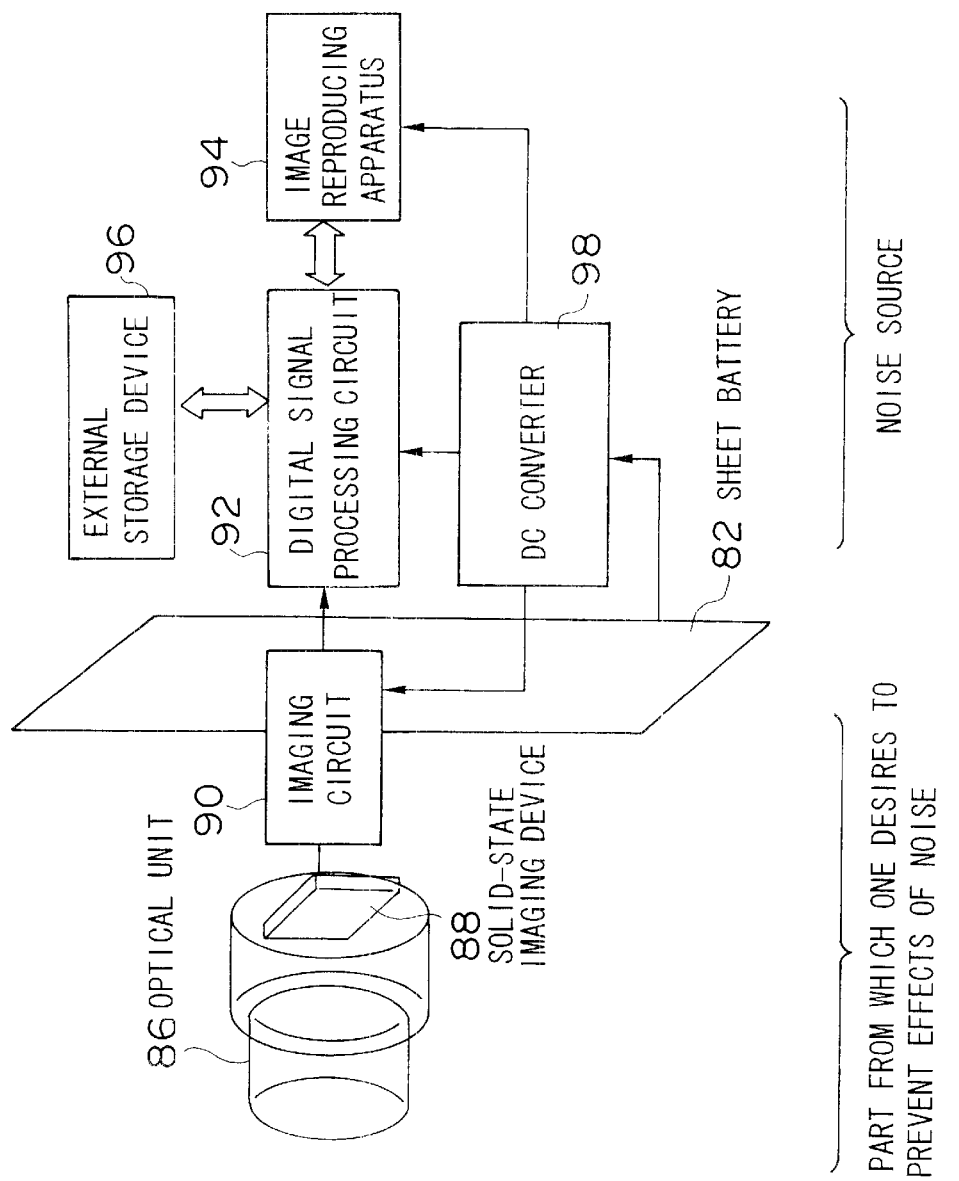
FIG. 7 is a view showing a structure of the electronic camera that uses the sheet batteries.

FIG. 7 is a view showing a structure of an electronic camera that uses a sheet battery. The electronic camera 70 comprises an optical unit 86, a solid state imaging device 88, an imaging circuit 90, a digital signal processing circuit 92, an image reproducing device 94, an external storage device 96, the sheet battery 82, and a dc converter 98. The optical unit 86 as a taking lens includes a zoom lens and an iris. Light which enters through the optical unit 86 is received on a light-receiving face of the solid stage imaging device 88 and forms an image, then is photo-electrically converted by the solid state imaging device 88. The image signal which is read out from the solid state imaging device 88 is transmitted to the imaging circuit 90 and is performed processes at this stage such as sampling hold, color separation of R, G, B, signal level adjustment for the respective color signal, and so forth, then is converted into digital signals of R, G, and B by an A/D converter.

The image signal produced at the imaging circuit 90 is now transmitted to the digital signal processing circuit 92. The digital signal processing circuit 92 is an image processing device which is constructed by a digital signal processor (DSP), including a gamma correction circuit, a sharpness correction circuit, a contrast correction circuit, a brightness and color difference signal producing circuit, white balance correction circuit, and so forth. The R, G, B image data which is inputted into the digital signal processing circuit 92 is converted into the brightness signal (Y signal) and color difference signal (Cr, Cb signals), and at the same time predetermined processes such as gamma correction are performed. The image data that has gone through the required process is supplied to the image reproducing apparatus 94 or the external storage device 96, or both of them.

The image reproducing apparatus 94 is, for example, a color liquid crystal display. The image that is taken by the solid state imaging device 88 can be displayed at a real time on the screen of the image reproducing apparatus 94. A photographer can set a composition and the like by looking at the screen of the image reproducing apparatus 94.

In response to the pressing-down of a release button (not shown), an AE and AF are operated, and at the same time an exposure time of the solid state imaging device 88 is controlled, and image taking for recording is performed. The image which is taken in this manner is gone the required process at the digital signal processing circuit 92 and then is stored in the external storage device 96.

The external storage device 96 is, for example, a smart media (Solid-State Floppy Disk Card). The record media is not limited only to the smart media; a PC card, a compact flash, a magnetic disk, an optical disk, an optical magnetic disk, a memory stick, and the like may be used. Those readable and writable medium may be used electronically, magnetically, optically, or even combinations of the methods. A signal processing device and an interface suitable for the media are used.

Further, at a time of a reproducing mode, data is read out from the external storage device 96, and a reproduced image is outputted to the image reproducing apparatus 94.

The sheet battery 82 is used as a power for the electronic camera 70, and the electric power from the sheet battery 82 is converted into a predetermined voltage by the dc converter 98, and is supplied to a predetermined circuit block.

In the structure of the electronic camera 70 shown in FIG. 7, the respective blocks of the dc converter 98, the digital signal processing circuit 92, the image reproducing apparatus 94, and the external storage device 96 are considered as noise sources. On the other hand, the solid state imaging device 88 and the imaging circuit 90 (hereunder called an imaging circuit block) are a block from which one desires to prevent effects of noise. In view of above, the sheet battery 82 is arranged between the noise source and the imaging circuit block in order to use the sheet battery 82 also as the electromagnetic shielding member. By this arrangement, the effects of noise with respect to the imaging circuit block can be reduced.

Moreover, the sheet batteries in FIGS. 1–5 may be used also as the electromagnetic shielding member. For example, an analog signal processing circuit is arranged on the upper substrate 12 of the layered substrate 10 in FIG. 1, and a digital signal processing circuit is arranged on the lower substrate 14. Further, as seen from FIG. 8, the layered substrate 10 is arranged between the imaging circuit block and the noise source. With the layered substrate 10, the dc converter can be omitted, thus the digital signal processing circuit 92, the image reproducing apparatus 94, and the external storage device 96 are considered as noise sources. By the above-described arrangement, the sheet batteries 16, 18, and 20 within the layered substrate 10 serve as the electromagnetic shielding member, and the effects of noise can be prevented.

With an electronic camera and a movie camera provided with a function to record sound and image at the same time, an audio circuit and an imaging circuit would affect each other. Thus, the audio circuit for a microphone and associated parts and the imaging circuit including the solid state imaging device may be separate, and the sheet batteries are sandwiched between the audio circuit substrate and the imaging circuit substrate. For a compact audio device, the microphone and a recording device (deck) are separated and the sheet batteries are arranged therebetween.

As described above, by arranging sheet batteries between the substrate including the noise source and the substrate including the circuit from which one desires to prevent effects of noise, the electronic device which is compact and has little noise effects can be provided without using the electromagnetic shielding plate.

According to the layered substrate of the present invention, at least one substrate and at least one sheet battery form the layered substrate in layers. Thus, the voltages can be directly applied from the batteries to the electronic parts on the substrates. In particular, the sheet batteries are connected in series and layered, and the holes for the wires are formed to the electrode plates, whereby the voltages can be drawn according to the electrode plates to which the holes are formed.

Therefore, the wiring is simplified as well as circuit by omitting the dc converter and so forth, and the device in which the substrate is incorporated can be thin.

Furthermore, the sheet batteries are used also as the electromagnetic shielding member, thus the shield plate can be omitted.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A layered substrate, comprising:
   a substrate; and
   a sheet battery,
   wherein the substrate and the sheet battery form layers;
   wherein an electrode plate is disposed between the substrate and the sheet battery;
   wherein the layered substrate has a hole reaching a surface of the electrode plate of the sheet battery;
   wherein a wire is connectable to the electrode plate through the hole; and
   wherein electric power is drawable through the wire from the sheet battery.

2. The layered substrate as defined in claim 1, wherein the sheet battery comprises a plurality of layered sheet batteries, and wherein an electrode plate is disposed between each of said plurality of layered sheet batteries.

3. The layered substrate as defined in claim 2, wherein:
   the layered substrate has a hole reaching a surface of an electrode plate of one of the plurality of layered sheet batteries;
   a wire is connectable to the electrode plate through the hole; and
   electric power is drawable through the wire from the sheet battery.

4. The layered substrate as defined in claim 1, wherein:
   the layered substrate is divided into a plurality of areas; and
   a plurality of kinds of electric power of different voltages are respectively drawable from the plurality of areas.

5. A layered substrate comprising:
   a substrate; and
   a sheet battery, wherein:
   the substrate and the sheet battery form layers;
   the sheet battery comprises two ground electrode plates;
   the layered substrate further comprises a switch which electrically connects and disconnects the two ground electrode plates; and
   power is supplied from the sheet battery to electronic parts mounted on the substrate when the switch is closed, and the power is not supplied from the sheet battery to electronic parts when the switch is open.

6. A layered substrate comprising:
   a substrate; and
   a sheet battery,
   wherein the substrate and the sheet battery form layers; and
   wherein the layered substrate is arranged between an electric noise source and a circuit so that the noise of the electric noise source is prevented from affecting the circuit.

7. A layered substrate, comprising:
   a substrate on which electronic parts are mounted; and
   a sheet battery,
   wherein the substrate and the sheet battery stick to each other to form layers;
   wherein an electrode plate is disposed between the substrate and the sheet battery;
   wherein the layered substrate has a hole reaching a surface of the electrode plate of the sheet battery;
   wherein a wire is connectable to the electrode plate through the hole; and
   wherein electric power is drawable through the wire from the sheet battery.

8. The layered substrate as defined in claim 7, wherein the sheet battery comprises a plurality of layered sheet batteries connected in series, and wherein an electrode plate is disposed between each of said plurality of layered sheet batteries.

9. The layered substrate as defined in claim 8, wherein:
   the layered substrate has a hole reaching a surface of an electrode plate of one of the plurality of layered sheet batteries;
   a wire is connectable to the electrode plate through the hole; and
   electric power is drawable through the wire from the sheet battery.

10. The layered substrate as defined in claim 8, wherein:
    the layered substrate has two holes respectively reaching surfaces of two electrode plates of two of the plurality of layered sheet batteries;
    two wires are respectively connectable to the two electrode plates through the two holes; and
    two kinds of electric power of different voltages are respectively drawable through the two wires from the sheet battery.

11. The layered substrate as defined in claim 7, wherein:
    the layered substrate is divided into a plurality of areas; and
    a plurality of kinds of electric power of different voltages are respectively drawable from the plurality of areas.

12. A layered substrate comprising:
    a substrate on which electronic pails arc mounted; and
    a sheet battery, wherein:
    the substrate and the sheet battery stick to each other to form layers;
    the sheet battery comprises two ground electrode plates;
    the layered substrate further comprises a switch which electrically connects and disconnects the two ground electrode plates; and
    power is supplied from the sheet battery to electronic parts mounted on the substrate when the switch is closed, and the power is not supplied from the sheet battery to electronic parts when the switch is open.

13. A layered substrate comprising:
    a substrate on which electronic parts are mounted; and
    a sheet battery,
    wherein the substrate and the sheet battery stick to each other to form layers; and wherein the layered substrate is arranged between an electric noise source and a circuit so that the noise of the electric noise source is prevented from affecting the circuit.

14. A layered substrate, comprising:

two substrates on which electronic parts are mounted; and a sheet battery sandwiched between the two substrates,
wherein the two substrates and the sheet battery integrally form layers;
wherein an electrode plate is disposed between said sheet battery and each of said two substrates;
wherein the layered substrate has a hole reaching a surface of an electrode of the sheet battery;
wherein a wire is connectable to the electrode through the hole; and
wherein electric power is drawable through the wire from the sheet battery.

15. The layered substrate as defined in claim 14, wherein the sheet battery comprises a plurality of layered sheet batteries connected in series, and wherein an electrode plate is disposed between each of said plurality of layered sheet batteries.

16. The layered substrate as defined in claim 15, wherein:

the layered substrate has a hole reaching a surface of an electrode plate of one of the plurality of layered sheet batteries;

a wire is connectable to the electrode plate through the hole; and electric power is drawable through the wire from the sheet battery.

17. The layered substrate as defined in claim 15, wherein:

the layered substrate has two holes respectively reaching surfaces of two electrode plates of two of the plurality of layered sheet batteries;

two wires are respectively connectable to the two electrode plates through the two holes; and two kinds of electric power of different voltages are respectively drawable through the two wires from the sheet battery.

18. The layered substrate as defined in claim 14, wherein:

the layered substrate is divided into a plurality of areas; and a plurality of kinds of electric power of different voltages are respectively drawable from the plurality of areas.

19. A layered substrate comprising:

two substrates on which electronic parts are mounted; and a sheet battery sandwiched between the two substrates,
wherein
the two substrates and the sheet battery integrally form layers;
the sheet battery comprises two ground electrode plates;
the layered substrate further comprises a switch which electrically connects and disconnects the two ground electrode plates; and
power is supplied from the sheet battery to electronic parts mounted on the substrate when the switch is closed, and the power is not supplied from the sheet battery to electronic parts when the switch is open.

20. A layered substrate comprising:

two substrates on which electronic parts are mounted; and a sheet battery sandwiched between the two substrates, wherein the two substrates and the sheet battery integrally form layers, and wherein the layered substrate is arranged between an electric noise source and a circuit so that the noise of the electric noise source is prevented from affecting the circuit.

21. A layered substrate comprising:

two substrates on which electronic parts are mounted; and a sheet battery sandwiched between the two substrates, wherein:
the two substrates and the sheet battery integrally form layers;
one of the two substrates has a first pattern on which a digital circuit processing digital signals and including a noise source is mounted; and
the other of the two substrates has a second pattern on which an analog circuit processing analog signals is mounted so that noise of the noise source is prevented from affecting the analog circuit.

* * * * *